(12) United States Patent
Samsoniuk et al.

(10) Patent No.: US 11,804,666 B2
(45) Date of Patent: Oct. 31, 2023

(54) ELECTRICAL CONNECTOR AND PRINTED CIRCUIT BOARD WITH ELECTRICAL CONNECTORS

(71) Applicant: Unify Patente GmbH & Co. KG, Munich (DE)

(72) Inventors: Marcelo Samsoniuk, Curitiba (BR); Osvaldo Sato, Curitiba (BR); Diogo Granado, Curitiba (BR)

(73) Assignee: Unify Patente GmbH & Co. KG, Munich (DE)

( * ) Notice: Subject to any disclaimer, the term of this patent is extended or adjusted under 35 U.S.C. 154(b) by 291 days.

(21) Appl. No.: 17/280,234

(22) PCT Filed: Sep. 28, 2018

(86) PCT No.: PCT/EP2018/076520
§ 371 (c)(1),
(2) Date: Mar. 26, 2021

(87) PCT Pub. No.: WO2020/064130
PCT Pub. Date: Apr. 2, 2020

(65) Prior Publication Data
US 2022/0045447 A1 Feb. 10, 2022

(51) Int. Cl.
*H01R 13/60* (2006.01)
*H01R 12/70* (2011.01)
(Continued)

(52) U.S. Cl.
CPC ..... *H01R 12/7052* (2013.01); *H01R 12/7064* (2013.01); *H01R 12/7076* (2013.01);
(Continued)

(58) Field of Classification Search
CPC ............ H01R 12/7011; H01R 12/7052; H01R 12/7064; H01R 12/7076; H01R 12/727;
(Continued)

(56) References Cited

U.S. PATENT DOCUMENTS

2010/0167583 A1  7/2010  Lin et al.
2010/0210124 A1  8/2010  Li

FOREIGN PATENT DOCUMENTS

DE    3915777 A1    11/1989
EP    2955791 A1    12/2015
WO    2008094655 A2  8/2008

OTHER PUBLICATIONS

International Search Report for PCT/EP2018/076520 dated May 23, 2019.
(Continued)

*Primary Examiner* — Khiem M Nguyen
(74) *Attorney, Agent, or Firm* — Buchanan Ingersoll & Rooney PC

(57) ABSTRACT

An electrical connector mountable to a substrate (e.g. a Printed Circuit Board, PCB) can include a terminal housing having a front wall and an opposing back wall. An opening is provided in the front wall for receiving a plug inside the terminal housing, opposing side walls, and a top wall and an opposing bottom wall. The bottom wall has an inner surface facing the inside of the terminal housing and an outer surface facing away from the inside of the terminal housing. The outer surface (can have at least two retention pins projecting from the outer surface for being inserted into corresponding holes in the PCB. A first retention pin can be positioned on the outer surface so as to be arranged asymmetrically with respect to a second retention pin.

18 Claims, 6 Drawing Sheets

(51) Int. Cl.
    *H01R 12/72* (2011.01)
    *H01R 13/514* (2006.01)
    *H05K 1/18* (2006.01)
(52) U.S. Cl.
    CPC ......... *H01R 12/727* (2013.01); *H01R 13/514* (2013.01); *H05K 1/181* (2013.01); *H05K 2203/1572* (2013.01)
(58) Field of Classification Search
    CPC ...... H01R 13/46; H01R 13/514; H05K 1/181; H05K 2203/1572
    USPC ................................................. 439/567, 571
    See application file for complete search history.

(56) References Cited

OTHER PUBLICATIONS

Written Opinion of the International Searching Authority for PCT/EP2018/076520 dated May 23, 2019.

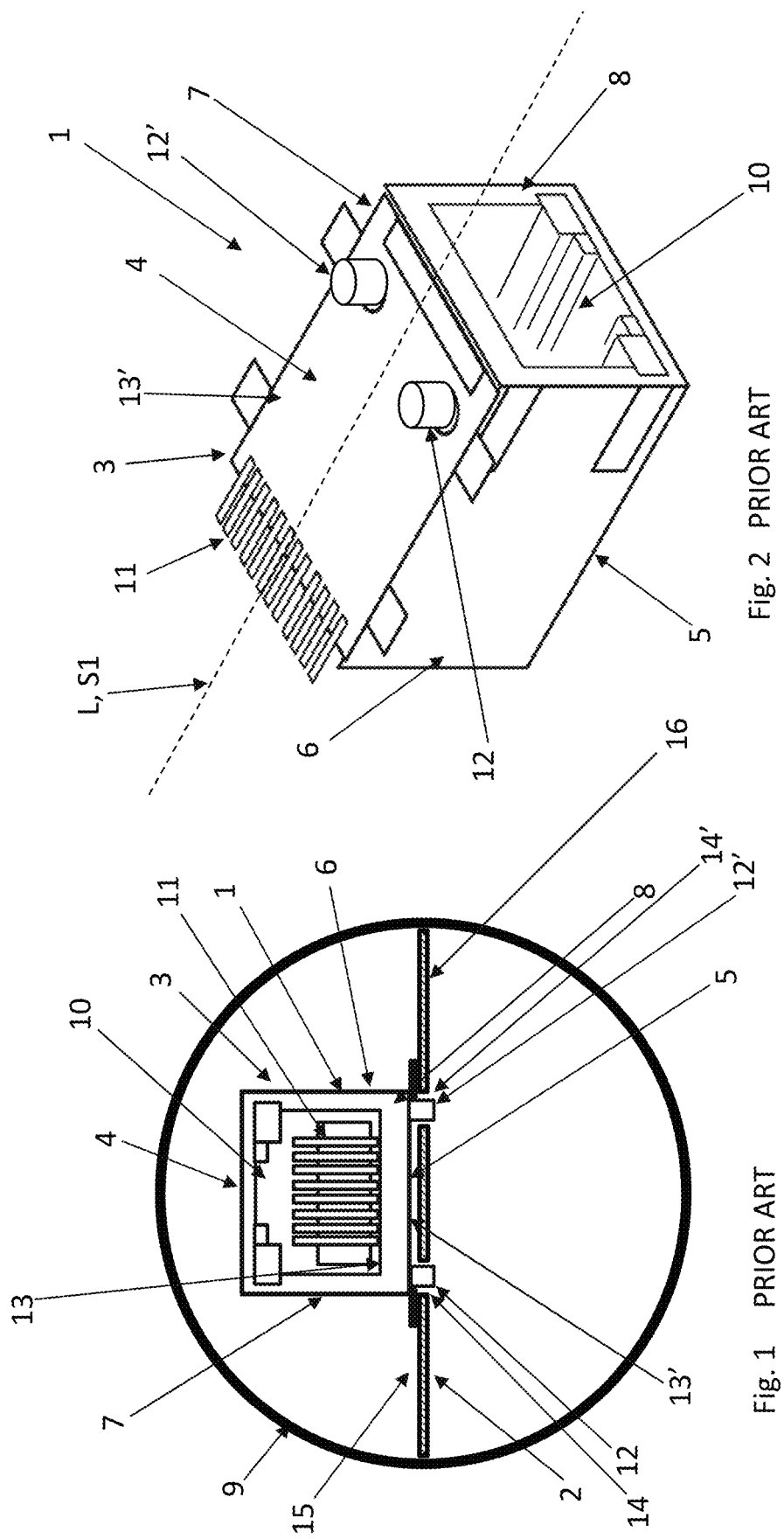

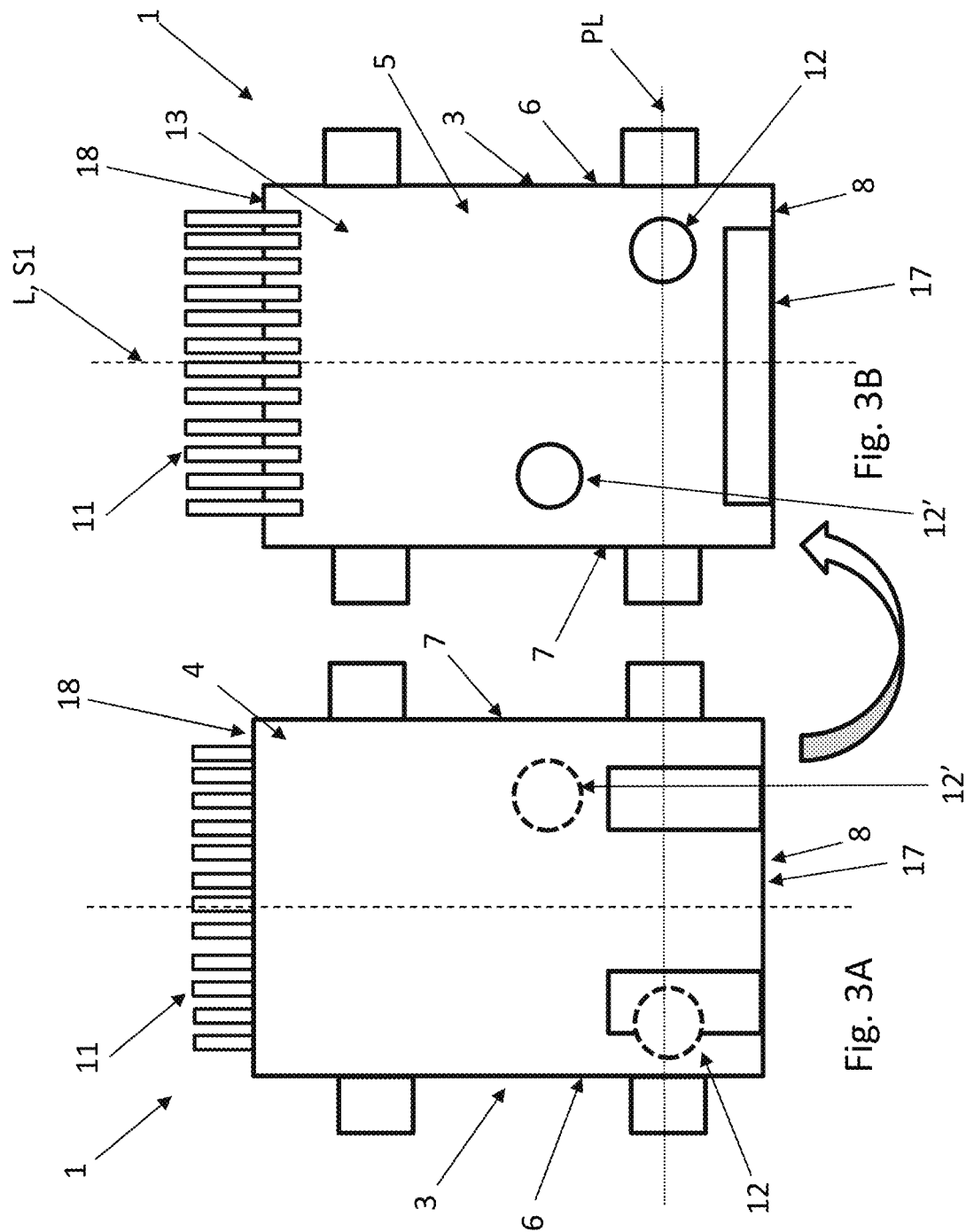

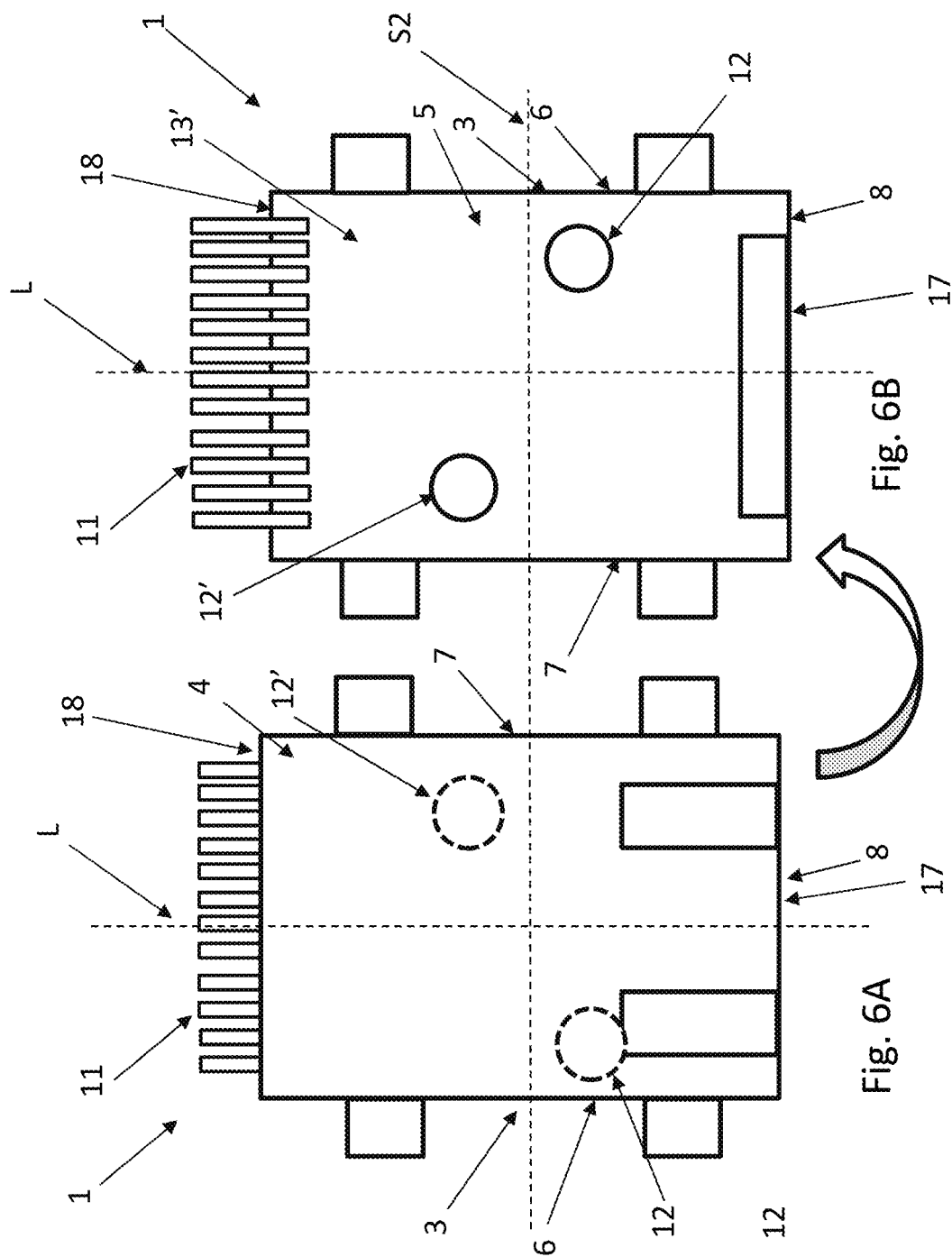

ELECTRICAL CONNECTOR AND PRINTED CIRCUIT BOARD WITH ELECTRICAL CONNECTORS

CROSS-REFERENCE TO RELATED APPLICATIONS

The present application is the U.S. national stage application of International Patent Application No. PCT/EP2018/076520, filed on Sep. 28, 2018. The entirety of this application is incorporated by reference herein.

FIELD

The present invention relates to an electrical connector and a Printed Circuit Board (PCB).

BACKGROUND

In prior art, various electrical connector types are known. For example, electrical connectors can be used on PCBs for connecting electronic devices to the PCB.

In the modern electronic projects, however, the available space must be optimized in order to use as little of the PCB area as possible so as to be able to arrange or connect as many electrical devices to it as possible. Namely, by using less space, the PCBs may be made smaller and less material is used, meaning the costs can be reduced.

Regarding, for example, modern IP surveillance cameras having, e.g., a cylindrical housing, the PCB has to be positioned in the middle or center of the housing so as to be able to use the maximum available space inside de housing for the electronic devices, as illustrated in FIG. 2.

Further, in order to save space with respect to configurations as outlined above, in prior art it is known to mount electronic devices and/or respective connectors on both sides of the PCB, thereby enabling a far more compact design compared to mounting the connectors only on one and the same side. Such an electrical connector known from prior art is shown in FIG. 1.

Also, various ways of mounting or fixing electrical connectors to the PCBs are known. One rather convenient way for mounting electrical connectors on a PCB is the use of so-called mounting pegs or mounting posts which project from the bottom side of the electrical connector housing and which fit into a correspondingly provided hole of the PCB. Usually, these mounting pegs or mounting posts are made of the same material as the electrical connector housing itself, typically a dielectric plastic material so that they can be produced in a cost-efficient manner.

SUMMARY

Electrical connectors which are fixed on a PCB as described above, are subject to mechanical limitations, e.g. tensile strength. For example, one problem existing with respect to the use of the above mentioned mounting pegs is that a user can accidently remove the electrical connector when inserting or removing a cable. In order to avoid this, in prior art it is known to arrange the mounting pegs or reinforcement pins, usually two pins, such that they are positioned in a horizontally symmetrical position. In this regard, horizontally symmetrical position refers to a position on the bottom surface of the connector housing which the mounting pegs project from, whereby the bottom surface defines a horizontal plane.

However, with such a symmetrical arrangement, it is not possible to mount two electrical connectors back to back on opposite sides of the PCB, since the mounting pegs or retention or reinforcement pins will match regarding the respective position on both opposing sides of the PCB and they will use the same holes in the PCB so that in the end, the electrical connectors cannot be correctly fixed to it.

A possibility of an arrangement of electrical connectors fixed to the PCB on both sides by means of the above mentioned retention or reinforcement pins is to mount them with a certain displacement from each other, or simply side by side on only one side of the PCB, or a double-height connector has to be used. However, in some cases there is no space for side-by-side mounting. Further, with respect to a double-height connector, there exists a problem that the PCB position has to be changed (for example regarding the central position of the PCB in a cylindrical housing, as mentioned above). Moreover, the use of a double-height electrical connector has the further disadvantage that it is subject to a torque effect, so that the surface mounting option is not suitable for electrical connectors of such dimensions.

Other types of fixation, for example, by soldering the electrical connectors to the respective surfaces of the PCB, although allowing for a back-to-back positioning of the electrical connectors on both sides of the PCB, require more effort from mounting, and thus in some cases may be rather inconvenient.

Thus, in prior art, as to electrical connectors specifically fixed to a PCB by means of retention pins or mounting pegs, there exists a problem that it is not possible to position the latter on both sides of the PCB at the same location, namely, back-to-back.

Therefore, it is an object of the present invention to provide an electrical connector and a corresponding PCB with electrical connectors which overcome the above mentioned problem, and which allow for a space-saving back-to-back arrangement of the electrical connectors on both sides of the PCB.

This object is solved according to the present invention by an electrical connector and a PCB as well as methods of making and using the PCB and/or electrical connector.

According to embodiments of the invention, an electrical connector is provided, which is mountable to a substrate, in particular, to a Printed Circuit Board (PCB), the electrical connector comprising a terminal housing, the terminal housing having a front wall and an opposing back wall, wherein an opening is provided in the front wall for receiving a plug inside the terminal housing, two opposing side walls, and a top wall and an opposing bottom wall, wherein the bottom wall has an inner surface facing the inside of the terminal housing and an outer surface facing away from the inside of the terminal housing, the outer surface being provided with at least two retention pins projecting from the outer surface for being inserted into corresponding holes in the PCB, wherein a first retention pin of the at least two retention pins is positioned on the outer surface so as to be arranged asymmetrically with respect to a second retention pin of the at least two retention pins.

In embodiments of the inventive electrical connector, space can be saved because it is possible to arrange two electrical connectors in a back-to-back mounting on a PCB. The same electrical connectors can be used on both sides. In particular, nothing has to be changed with respect to the retention pins, because according to the asymmetrical arrangement, they will not interfere. Thus, components, which are equipped with electrical connectors according to the present invention can be made smaller, and also can be manufactured in a cost efficient manner.

According to a preferred embodiment, the asymmetrical arrangement of the first retention pin and the second retention pin is an axial asymmetry about a first axial symmetry axis running in the longitudinal direction of the terminal housing from the front wall to the back wall.

According to a further preferred embodiment, the first axial symmetry axis runs through the center of the terminal housing.

According to another preferred embodiment, the asymmetrical arrangement of the first retention pin and the second retention pin is an axial asymmetry about a second axial symmetry axis running from a first side wall of the two opposing side walls to the second side wall of the two opposing side walls.

Preferably, the second axial symmetry axis runs through the center of the terminal housing.

According to still a further preferred embodiment, the at least two retention pins are arranged at the bottom surface of the terminal housing so as to not be symmetrical about a rotation axis extending in the longitudinal direction of the terminal housing from the front wall to the back wall.

Preferably, two retention pins are provided on the bottom surface of the surface housing.

Moreover, embodiments of a Printed Circuit Board (PCB) are provided. Embodiments of the PCB can include holes for receiving at least two electrical connectors according to any one of the preceding claims, wherein a first electrical connector is arranged on a top side of the PCB and a second electrical connector is arranged on the opposing bottom side of the PBC at the same location of the first electrical connector.

Preferably, the first electrical connector and the second electrical connector arranged on opposing sides at the same location of the PCB are identical with respect to the position of the retention pins provided on their respective bottom surfaces.

According to another preferred embodiment, the first electrical connector and the second electrical connector respectively are fixed to the PCB only by means of the retention pins.

Other details, objects, and advantages of the electrical connector, PCB, telecommunications apparatus, system, device, and methods of making and using the same will become apparent as the following description of certain exemplary embodiments thereof proceeds.

BRIEF DESCRIPTION OF THE DRAWINGS

The invention and embodiments thereof will be described below in further detail in connection with the drawings.

FIG. 1 shows a perspective view of an electrical connector according to prior art;

FIG. 2 shows the electrical connector according to prior art shown in FIG. 1 mounted in a cylindrical housing;

FIG. 3A shows a top view of a first exemplary embodiment of an electrical connector according to an embodiment of the invention;

FIG. 3B shows a bottom view of the electrical connector according to the first exemplary embodiment of an embodiment of the invention;

FIG. 6A is a top view of another exemplary embodiment of an electrical connector according to an embodiment of the invention; and FIG. 6B is a bottom view of the electrical connector 1 shown in FIG. 6A.

Figure 4A:
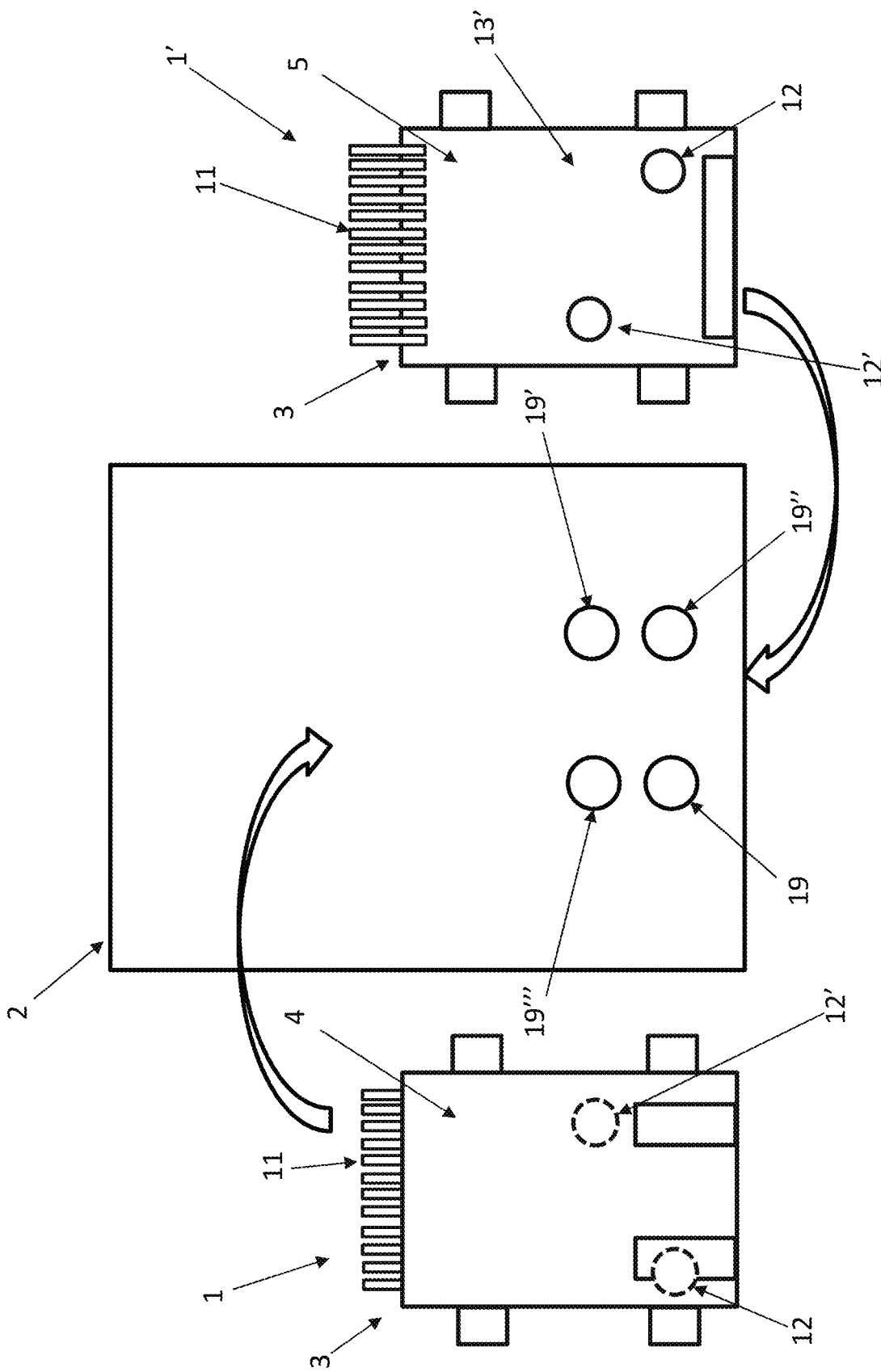
FIG. 4A shows a schematic illustration for placing two electrical connectors according to an embodiment of the invention.

Reference numerals used in the drawings include:
1, 1' electrical connector
2 Printed Circuit Board PCB
3 terminal housing
4 top wall
5 bottom wall
6 side wall
7 side wall
8 front wall
9 cylindrical housing of IP surveillance camera
10 opening
11 connection terminals
12, 12' first and second retention pins
13, 13' inner and outer surface of bottom wall
14, 14' holes in PCB
15 upper side of PCB
16 lower side of PCB
17 front edge
18 rear edge
19, 19', 19", 19'" holes in PCB
L longitudinal axis
S1 first axial symmetry axis
S2 second axial symmetry axis
PL parallel line

DETAILED DESCRIPTION

FIG. 1 shows an electrical connector 1 according to prior art in a perspective view, wherein the electrical connector 1 is shown upside down. As can be seen here, the electrical connector comprises a terminal housing 3 with a top wall 4 (in the figure, since the electrical connector 1 is shown upside down, the lower wall) and an opposing bottom wall 5 (in the figure, since the electrical connector 1 is shown upside down, the upper wall), two opposing side walls 6, 7, and a front wall 8 as well as an opposing back wall (not visible in the figure). The front wall 8 is provided with an opening 10 for receiving a corresponding plug (not shown) of an electrical device or the like in the inside of the terminal housing 3.

Further, connection terminals 11 are provided which electrically connect a plug, when inserted into the inside of the electrical connector 1 with a Printed Circuit Board 2 (see FIG. 2).

The bottom wall 5 has an inner surface 13 facing the inside of the terminal housing 3 and an outer surface 13' facing away from the inside of the terminal housing 3. On the outer surface 13' of the bottom wall 5, there are provided two reinforcement or retention pins, also referred to as mounting pegs, namely, a first retention pin 12 and a second retention pin 12' so as to project substantially perpendicular from the outer surface 13' of the bottom wall 5. The first and second retention pins 12, 12' are arranged on the outer surface 13' so as to be symmetrical with respect to an axial symmetry axis S extending along the longitudinal direction or longitudinal axis L of the bottom wall 5 of the terminal housing 3, whereby the axial symmetry axis S runs through the center of the bottom wall 5.

The retention pins 12, 12' are provided so that they are retained in the PCB firmly and a user will not be able to accidentally remove the electrical connector 1 from the PCB when inserting or removing a plug of a cable of an electrical device in/out of the terminal housing 3.

FIG. 2 shows the electrical connector 1 illustrated in FIG. 1 mounted in a cylindrical housing 9 of an IP surveillance camera. In order to use the maximum available space inside the cylindrical housing 9 of the camera for electronical devices, the PCB 2 is arranged in the middle of the cylinder, whereby the two retention pins 12, 12' provided on the outer surface 13' of the bottom wall 5 of the terminal housing 3 of the electrical connector 1 are inserted into two corresponding holes 14, 14' provided in the PCB 2. As can be seen, the electrical connector 1 is provided on the upper side 15 of the PCB 2, whereas on the lower side 16, no electrical connector is provided. This would not be possible, since the two holes 14, 14' are already occupied by the retention pins 12, 12' of the electrical connector 1 on the upper side 15. Thus, the lower half of the cylindrical housing 9 remains unused and much space is wasted.

FIG. 3A is a top view on an electrical connector 1 according to an embodiment of the invention, and FIG. 3B is a bottom view of the electrical connector 1. As can be seen in FIG. 3B, the position of the retention pins 12a, 12b has been changed, namely, so as to no longer be symmetrical with respect to the first axial symmetry axis S1, which extends along the longitudinal axis L of the bottom wall 5 of the terminal housing 3 as a center line. Here, the position of the first retention pin 12 basically has been maintained, as compared to the example of the prior art described above in connection with FIG. 1 and FIG. 2. However, the position of the second retention pin 12' has been shifted somewhat backwards towards the rear edge 18 of the terminal housing 3 so that the two retention pins 12, 12' no longer are arranged on a line parallel PL to the front edge 17 of the terminal housing 3. Rather, one of the two retention pins 12, 12', here the second retention pin 12' is displaced from this line, thereby, resulting in an asymmetrical arrangement with respect to the first axial symmetry axis S1. As can be seen in FIG. 3a, which is a view on the top wall 4 of the terminal housing, with the position of the retention pins 12, 12' on the bottom wall 5 illustrated by dashed-line circles, when the terminal housing 3 is turned around by 180° about a rotation axis R extending in parallel to the longitudinal axis L of the bottom wall 5 of the terminal housing 3, then the first retention pin 12 (in FIG. 3B located in the front on the right hand side) will be located in the front on the left hand side, and the second retention pin 12' (in FIG. 3B located on the left hand side displaced backwards with respect to the position of the first retention pin 12') will be located on the left hand side in its backwards displaced position.

Figure 4B:
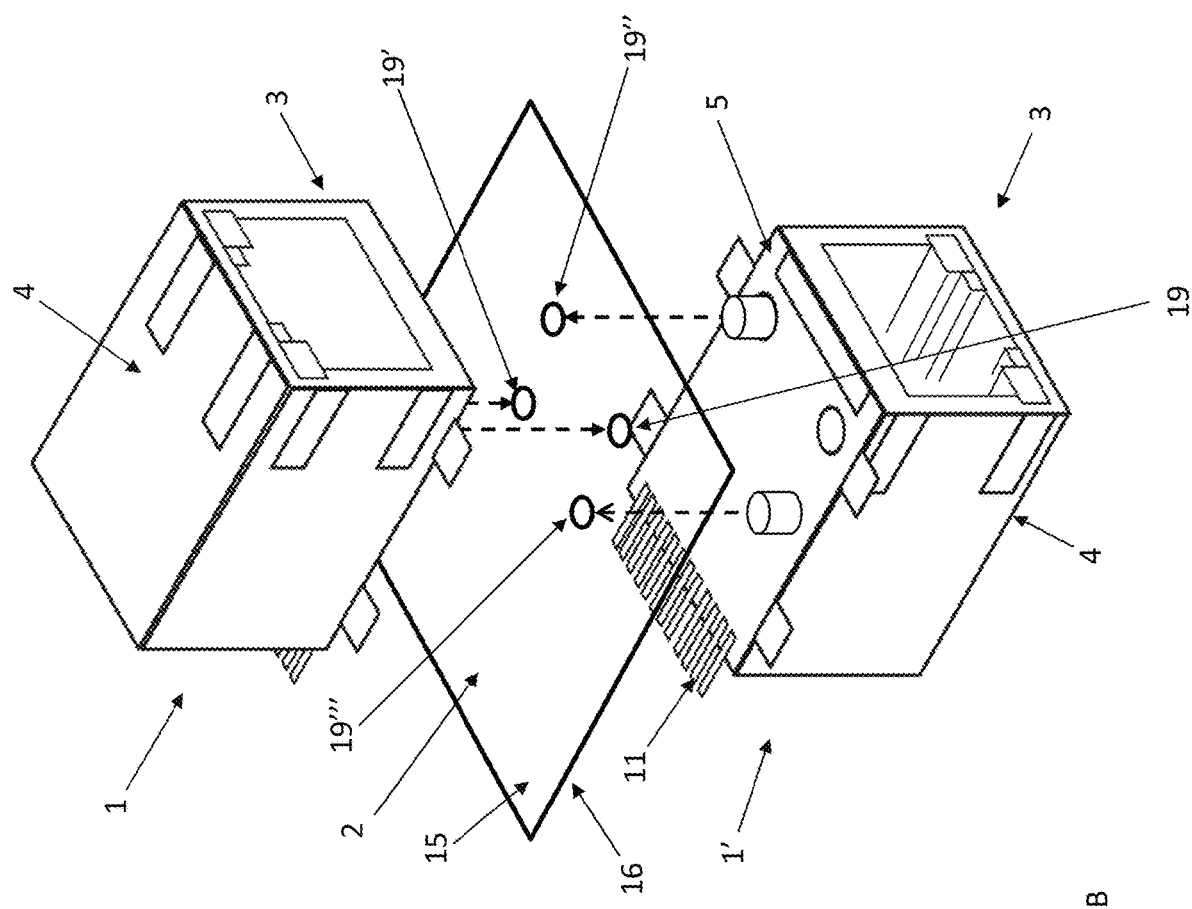
FIG. 4B shows a schematic illustration for placing two electrical connectors according to an embodiment of the invention.

FIG. 4A and FIG. 4B respectively show a schematic illustration for placing two electrical connectors, namely, a first electrical connector 1 and a second identical electrical connector 1' in a back-to-back mounting on a PCB 2 whereby FIG. 4A is a top view and FIG. 4B is a perspective view. The first electrical connector 1 will be mounted on the upper side 15 of the PCB 2, with its first retention pin 12 fitted into a first hole 19 and its second retention pin 12' fitted into a second hole 19' of the PCB 2. The second electrical connector 1' will be mounted on the lower side 16 of the PCB 2, opposing the first electrical connector 1, with its first retention pin 12 fitted into a third hole 19'' and its second retention pin 12' fitted into a fourth hole 19''' provided in the PCB 2. Thus, for, for example, electrical connectors 1 respectively provided with two retention pins, the PCB 2 has to be provided with four corresponding holes. Of course, more than two retention pins can also be used, as long as the principle of the present invention concerning the asymmetrical arrangement is followed and as long as the PCB 2 is provided with a corresponding number of holes, arranged at the respective positions so as to receive the retention pins therein.

Figure 5:
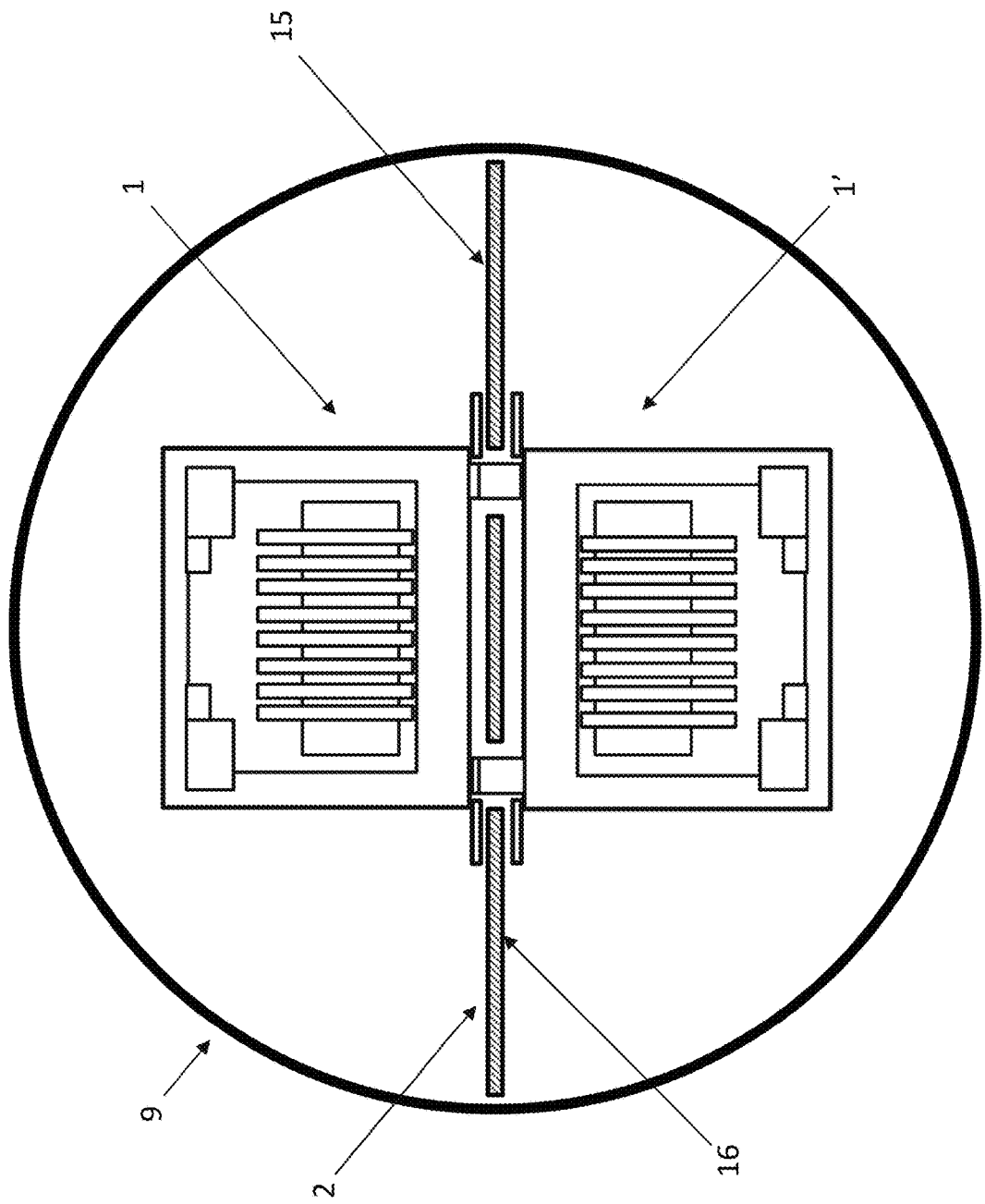
FIG. 5 shows an arrangement of two electrical connectors according to an embodiment of the invention mounted in a cylindrical housing.

FIG. 5 shows an arrangement of two electrical connectors 1, 1' according to an embodiment of the invention mounted in a cylindrical housing of an IP surveillance camera. As can be seen here, compared to the example according to prior art shown in FIG. 2 where only half of the housing is used, here, the entire space can be used, since two connectors 1, 1' can be placed in a back-to-back mounting on the PCB 2.

FIG. 6A is a top view on an electrical connector 1 according to another embodiment of the invention, and FIG. 6B is a bottom view of the electrical connector 1. In contrast to the embodiment shown in FIG. 3A, FIG. 3B, here, both retention pins 12a, 12b have been displaced backwards, and a an axis of symmetry (second axial symmetry axis S2) with respect to which the two retention pins 12a, 12b are arranged asymmetrically is perpendicular to the longitudinal axis L of the bottom wall 5 of the terminal housing, extending from one side wall 6 to the opposing side wall 7. The effect which is achieved by this arrangement is the same as already described with respect to FIG. 3A, FIG. 3B, namely, this arrangement of the pins enables a back-to-back positioning on a PCB 2.

Thus, while certain exemplary embodiments of an electrical connector, a PCB, telecommunication apparatus, telecommunication device, terminal device, a system, and methods of making and using the same have been shown and described above, it is to be distinctly understood that the invention is not limited thereto but may be otherwise variously embodied and practiced within the scope of the following claims.

The invention claimed is:

1. An electrical connector mountable to a substrate, the electrical connector comprising:
a terminal housing having a front wall and an opposing back wall, wherein an opening is provided in the front wall to receive a plug inside the terminal housing, the terminal housing also having opposing side walls, a top wall and an opposing bottom wall, wherein the bottom wall has an inner surface facing an inside of the terminal housing and an outer surface facing away from the inside of the terminal housing, the outer surface being provided with at least two retention pins projecting from the outer surface to be insertable into corresponding holes in the substrate;
the at least two retention pins comprising a first retention pin and a second retention pin, the first retention pin positioned on the outer surface so as to be arranged asymmetrically with respect to the second retention pin about a first axial symmetry axis running in a longitudinal direction of the terminal housing from the front wall to the back wall or about a second axial symmetry axis that extends between the opposing side walls and is perpendicular to the first axial symmetry axis.

2. The electrical connector of claim 1, wherein the substrate is a PCB.

3. The electrical connector of claim 1, wherein the at least two retention pins is only two retention pins, the two retention pins being the first retention pin and the second pin; and wherein the first retention pin is positioned on the outer surface so as to be arranged asymmetrically with respect to the second retention pin about the first axial symmetry axis running in the longitudinal direction of the terminal housing from the front wall to the back wall.

4. The electrical connector of claim 1, wherein the first axial symmetry axis runs through a center of the terminal housing.

5. The electrical connector of claim 1, wherein the first retention pin is positioned on the outer surface so as to be arranged asymmetrically with respect to the second retention pin about the second axial symmetry axis that extends between the opposing side walls and is perpendicular to the first axial symmetry axis.

6. The electrical connector of claim 5, wherein the second axial symmetry axis runs through a center of the terminal housing.

7. The electrical connector of claim 1, wherein the at least two retention pins are arranged at a bottom surface of the terminal housing so as to not be symmetrical about a rotation axis extending in the longitudinal direction of the terminal housing from the front wall to the back wall.

8. The electrical connector of claim 1, wherein the at least two retention pins are provided on a bottom surface of the terminal housing.

9. A Printed Circuit Board (PCB) comprising:
a board having holes for receiving at least two electrical connectors including a first electrical connector and a second electrical connector, each of the electrical connectors comprising:
a terminal housing having a front wall and an opposing back wall, wherein an opening is provided in the front wall to receive a plug inside the terminal housing, the terminal housing also having opposing side walls, a top wall and an opposing bottom wall, wherein the bottom wall has an inner surface facing an inside of the terminal housing and an outer surface facing away from the inside of the terminal housing, the outer surface being provided with at least two retention pins projecting from the outer surface to be insertable into corresponding holes in the substrate;
the at least two retention pins comprising a first retention pin and a second retention pin, the first retention pin positioned on the outer surface so as to be arranged asymmetrically with respect to the second retention pin about a first axial symmetry axis running in a longitudinal direction of the terminal housing from the front wall to the back wall or about a second axial symmetry axis that extends between the opposing side walls that is perpendicular to the first axial symmetry axis; and wherein the first electrical connector is arranged on an upper side of the PCB and the second electrical connector is arranged on an opposing lower side of the PCB at a corresponding location of the first electrical connector.

10. The PCB of claim 9, wherein the first electrical connector and the second electrical connector are arranged on opposing sides at the corresponding location of the PCB that are identical with respect to positions of the retention pins provided on their respective bottom surfaces.

11. The PCB of claim 10, wherein the first electrical connector and the second electrical connector are fixed to the PCB only by means of the retention pins.

12. The PCB of claim 9, wherein the first electrical connector and the second electrical connector are fixed to the PCB only by means of the retention pins.

13. The PCB of claim 9, wherein the longitudinal direction is a direction extending along a longitudinal axis of the bottom wall of the terminal housing between the front wall and the back wall such that the first axial symmetry axis extends along a center of the bottom wall.

14. The PCB of claim 9, wherein the first retention pin is positioned on the outer surface so as to be arranged asymmetrically with respect to the second retention pin about the first axial symmetry axis running in the longitudinal direction of the terminal housing from the front wall to the back wall.

15. The PCB of claim 9, wherein the first retention pin is positioned on the outer surface so as to be arranged asymmetrically with respect to the second retention pin about the second axial symmetry axis that extends between the opposing side walls that is perpendicular to the first axial symmetry axis.

16. The electrical connector of claim 1, wherein the longitudinal direction is a direction extending along a longitudinal axis of the bottom wall of the terminal housing between the front wall and the back wall such that the first axial symmetry axis extends along a center of the bottom wall.

17. The electrical connector of claim 1, wherein the first retention pin is positioned on the outer surface so as to be arranged asymmetrically with respect to the second retention pin about the first axial symmetry axis running in the longitudinal direction of the terminal housing from the front wall to the back wall.

18. The electrical connector of claim 1, wherein the first retention pin is positioned on the outer surface so as to be arranged asymmetrically with respect to the second retention pin about the second axial symmetry axis that extends between the opposing side walls that is perpendicular to the first axial symmetry axis.

* * * * *